United States Patent
Abhishek et al.

(10) Patent No.: US 10,312,929 B1
(45) Date of Patent: Jun. 4, 2019

(54) ANALOG-TO-DIGITAL CONVERSION WITH SAMPLING CAPACITOR PRE-CHARGING

(71) Applicant: NXP USA, INC., Austin, TX (US)

(72) Inventors: Kumar Abhishek, Austin, TX (US); Srikanth Jagannathan, Austin, TX (US); Shanaka Pradeep Yapa Appuhamillage Don, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/997,525

(22) Filed: Jun. 4, 2018

(51) Int. Cl.
| | |
|---|---|
| *H03M 1/12* | (2006.01) |
| *G11C 27/02* | (2006.01) |
| *H03M 1/00* | (2006.01) |
| *H03M 1/10* | (2006.01) |
| *H03M 1/80* | (2006.01) |

(52) U.S. Cl.
CPC .......... *H03M 1/1245* (2013.01); *G11C 27/02* (2013.01); *H03M 1/00* (2013.01); *H03M 1/10* (2013.01); *H03M 1/12* (2013.01); *H03M 1/802* (2013.01)

(58) Field of Classification Search
CPC .......... H03M 1/12; H03M 1/00; H03M 1/802; H03M 1/10; G11C 27/02
USPC ................ 341/155, 156, 172, 122, 120, 158
See application file for complete search history.

(56) References Cited

U.S. PATENT DOCUMENTS

| | | | |
|---|---|---|---|
| 7,420,490 | B2 | 9/2008 | Gupta et al. |
| 9,429,630 | B2 | 8/2016 | Zhu et al. |
| 9,571,118 | B1 | 2/2017 | Gupta et al. |
| 9,571,308 | B1 | 2/2017 | Lugthart et al. |
| 2017/0350756 | A1* | 12/2017 | Panicacci .............. G01J 1/4228 |

* cited by examiner

*Primary Examiner* — Joseph J Lauture

(57) ABSTRACT

The embodiments described herein provide analog-to-digital converters and methods that can reduce the likelihood of excessive voltage drop during the conversion of weakly driven signals while still providing the ability to perform an accurate analog-to-digital conversion. In general, the embodiments described herein reduce the likelihood of excessive voltage drop during the conversion of weakly driven signals by pre-charging the sampling capacitor used in the conversion. For example, the embodiments can apply the buffered input signal apply to the sampling capacitor for a first sampling cycle to pre-charge the sampling capacitor, and then directly apply the unbuffered input signal to the sampling capacitor for a second sampling cycle to final-charge the sampling capacitor. With the sampling capacitor charged using the two stage charging, a digital output corresponding to the charge of the sampling capacitor is generated.

19 Claims, 4 Drawing Sheets

ANALOG-TO-DIGITAL CONVERSION WITH SAMPLING CAPACITOR PRE-CHARGING

TECHNICAL FIELD

Embodiments relate generally to analog-to-digital conversion, and more particularly, embodiments of the subject matter relate to analog-to-digital converters (ADCs) and the conversion of weakly driven analog signals.

BACKGROUND

In many modern electronics applications, it is needed to convert an analog value to a digital value. For example, it some applications it can be needed to convert a continuous physical quantity (such as a voltage) to digital value that represents the amplitude of the physical quantity. Analog-to-digital converters (ADC's) are electronic devices that can be implemented to provide such conversions.

One issue in ADCs is the need for conversion of weakly driven signals. In general, weakly driven signals are those with relatively large source impedance (e.g., a source impedance of greater than 1 Mega ohm). A signal having such a relatively large source impedance can have a temporarily drop in voltage with even a moderate current flow. This temporary drop of the voltage can cause a variety of unwanted effects on its associated system.

For example, in one application the weakly driven signal is a reference signal used to provide a reference voltage during operation of the device. When such a weakly driven reference signal is measured by a traditional ADC, the voltage of the reference signal can temporarily drop below a critical level. This temporary drop of the reference signal below the critical level can have a variety of unwanted effects. For example, in some applications the temporary drop in voltage of the reference signal may cause a system reset or other unwanted event.

Unfortunately, current techniques for analog-to-digital conversion can lack the ability to accurately measure weakly driven signals without causing such a temporary voltage drop and resulting unwanted events. Thus, what are needed are improved devices and techniques for the analog-to-digital conversion of weakly driven signals that can reduce the likelihood of excessive voltage drop during analog-to-digital conversion.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

The embodiments described herein can provide for accurate analog-to-digital conversion while reducing the occurrence of unwanted events. Specifically, the embodiments described herein provide systems and methods for analog-to-digital conversion that can reduce the likelihood of excessive voltage drop during the conversion of weakly driven signals while still providing the ability to perform an accurate analog-to-digital conversion.

In general, the embodiments described herein reduce the likelihood of excessive voltage drop during the conversion of weakly driven signals by pre-charging the sampling capacitor used in the conversion. Specifically, the embodiments selectively apply an input signal that can be weakly driven and a buffered input signal to the sampling capacitor. For example, the embodiments can apply the buffered input signal to the sampling capacitor for a first sampling cycle to pre-charge the sampling capacitor, and then directly apply the unbuffered input signal to the sampling capacitor for a second sampling cycle to final-charge the sampling capacitor. With the sampling capacitor charged using the two stage charging, a digital output corresponding to the charge of the sampling capacitor is generated.

In such embodiments, the pre-charging of the sampling capacitor during the first sampling cycle occurs with a buffered input signal, and this use of the buffered input signal can reduce the amount of voltage drop that occurs in the input signal during both the pre-charge and final-charge. Specifically, the use of the buffer to generate the buffered input signal will significantly reduce the voltage drop that would otherwise occur during the pre-charge because of the increased current drive provided by the buffer. Then, during the final charging of the sampling capacitor the input signal can be directly applied to the sampling capacitor without causing an excessive amount of voltage drop because the sampling capacitor already contains significant charge and is relatively near the final voltage before the input signal is directly applied.

Furthermore, because the final charging of the sampling capacitor is performed directly from the input signal, the final charge on the sampling capacitor will accurately reflect the input signal without any potential offset being introduced by the buffer or other such intervening elements. Thus, the embodiments described herein can both reduce the likelihood of excessive voltage drop during the conversion of weakly driven signals while also providing an accurate analog-to-digital conversion of those weakly driven signals.

Figure 1:
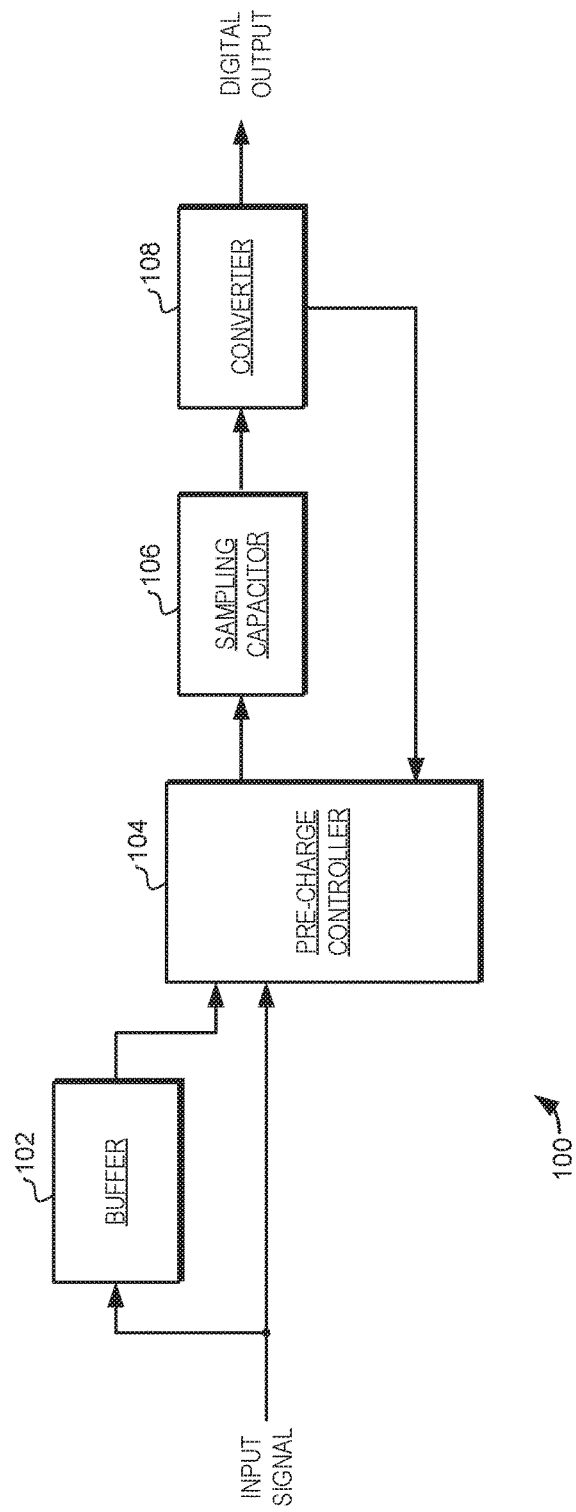
FIG. 1 shows a generalized block diagram of an analog-to-digital converter (ADC) in accordance with an embodiment.

Turning now to FIG. 1, a schematic view of a portion of an analog-to-digital converter (ADC) 100 is illustrated. The illustrated portion of ADC 100 includes a buffer 102, a pre-charge controller 104, a sampling capacitor 106, and a converter 108. In accordance with the embodiments described herein, the ADC 100 can facilitate the digital conversion of analog input signals, including weakly driven input signals, using the pre-charge controller 104.

In this illustrated embodiment the pre-charge controller 104 is configured to selectively apply an input signal to the sampling capacitor 106. Specifically, the input signal is selectively applied to the sampling capacitor 106 directly and through the buffer 102.

As one specific example, the pre-charge controller 104 can be configured to apply a buffered input signal generated by the buffer 102 to the sampling capacitor 106 for a first sampling cycle to pre-charge the sampling capacitor 106. The pre-charge controller 104 can be configured to next directly apply the input signal to the sampling capacitor 106 for a second sampling cycle to put a final charge on the sampling capacitor 106. With the sampling capacitor 106 charged using this two-step charging procedure, the converter 108 can generate digital output corresponding to the final charge of the sampling capacitor 106.

The use of the two-step charging procedure can significantly reduce the amount of voltage drop that would otherwise occur during charging of the sampling capacitor 106. Specifically, the use the of the buffer 102 to generate the buffered input signal will significantly reduce the voltage drop that would otherwise occur during the pre-charging step because of the increased current drive provided by the buffer 102. Then, during the final charging step the potential for voltage drop is also reduced because the previously applied charge on the sampling capacitor 106 reduces the voltage difference between the input signal and the sampling capacitor 106 and thus reduces the current draw from the input signal during the final charging step.

Furthermore, because the final charging of the sampling capacitor 106 is performed directly from the input signal, the final charge on the sampling capacitor 106 will accurately reflect the input signal without any potential offset being introduced by the buffer 102 or other such device. Thus, the final voltage on the sampling capacitor 106 will accurately reflect the input signal voltage. The digital output generated by the converter 108 will thus accurately reflect the input signal, without any offset or other error caused by the buffer 102.

The pre-charge controller 104 can be implemented to provide this two-stage charging of the sampling capacitor 106 with variety of circuits, structures and devices. In one embodiment, pre-charge controller 104 includes a switch configured to selectively switch between the buffered input signal and the unbuffered, directly applied input signal. In some embodiments, this switch can be implemented with a suitable multiplexer. In one embodiment, the pre-charge controller 104 is configured to receive an end-of-sampling signal from the converter 108. In such an embodiment the pre-charge controller 104 can be configured to switch between applying the buffered input signal to the sampling capacitor 106 and applying the input signal to the sampling capacitor 106 in response to the end-of-sampling signal. One specific implementation will be discussed in greater detail below with reference to FIG. 3. Additionally, the pre-charge controller 104 can be implemented such that the first sampling cycle and the second sampling cycle are consecutive sampling cycles in the ADC.

In general, the buffer 102 can be implemented with any suitable buffer, including a variety of unity gain buffers commonly used. Likewise, the sampling capacitor 106 can be implemented with any suitable capacitor design and technology. The converter 108 can likewise be implemented with any suitable type of analog-to-digital conversion techniques and devices.

As noted above, the embodiments described herein can be used to provide accurate conversion of a variety of input signals, including weakly driven input signals. For example, these embodiments can be used to provide conversion of reference signals used for a variety of purposes, including band gap reference signals. Furthermore, these input signals can include both reference signals that are on the same semiconductor die with the ADC 100 and input signals that are from sources external to the die.

Figure 2:
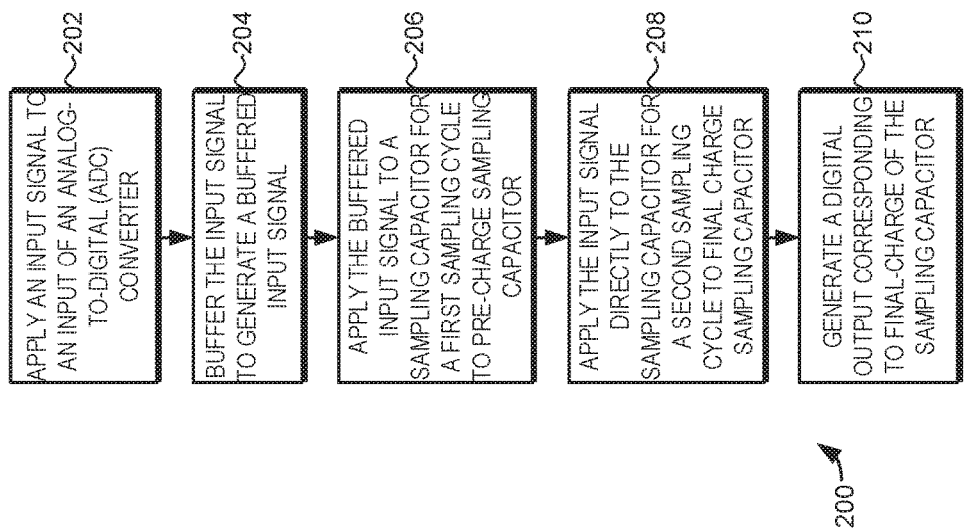
FIG. 2 shows a method of analog-to-digital conversion in accordance with an embodiment.

Turning now to FIG. 2, a method 200 for performing an analog-to-digital conversion is illustrated. In accordance with the embodiments described herein, the method 200 can facilitate the accurate digital conversion of analog input signals, including weakly driven input signals using a two-step charging procedure.

The first step 202 is to apply an input signal to the input of the analog-to-digital converter (ADC). As described above, this input signal can be any suitable type of analog value, including weakly driven signals such as reference signals, including band gap reference signals. Furthermore, this input signal can originate from outside the device or within the device. In any case the input signal provides the values that are to be converted to a digital output.

The next step 204 is to buffer the input signal to generate a buffered input signal. Again, a variety of devices can be used to buffer the input signal, including any suitable unity gain buffer. So generated by a suitable buffer, the buffered input signal can be more strongly driven than the original input signal.

The next step 206 is to apply the buffered input signal to the sampling capacitor for a first sampling cycle. This step puts a pre-charge on the sampling capacitor. Again, the use of the buffered input signal to pre-charge the sampling capacitor can significantly reduce the voltage drop that would otherwise occur during charging of the sampling capacitor because of the increased current drive in the buffered input signal.

The next step 208 is to apply the input signal directly to the sampling capacitor for a second sampling cycle. This step puts a final charge on the sampling capacitor. The likelihood of excessive voltage drop on the input signal occurring during this step is again reduced because the previously applied pre-charge reduces the voltage difference between the input signal and the sampling capacitor, and thus reduces the current required from the input signal during the step 208. Thus, even a weakly driven signal such as a band-gap reference signal will not have an excessive voltage drop during the final charging that occurs in step 208.

Furthermore, because step 208 charges the sampling capacitor directly from the input signal, the final charge on the sampling capacitor can more accurately reflect the input signal without any potential offset being introduced by any buffers or similar devices. This results in the final voltage on the sampling capacitor that more accurately represents the input signal voltage, even when the original input signal is a relatively small and weakly driven band-gap reference signal.

The next step 210 is to generate a digital output corresponding to the final charge on the sampling capacitor. This step can be performed using any suitable analog-to-digital conversion techniques and methods. Furthermore, because the final voltage on the sampling capacitor more accurately reflected the input signal voltage, the digital output generated by step 210 can more accurately reflect the input signal, without any offset or other error caused by buffers or similar devices.

Figure 3:
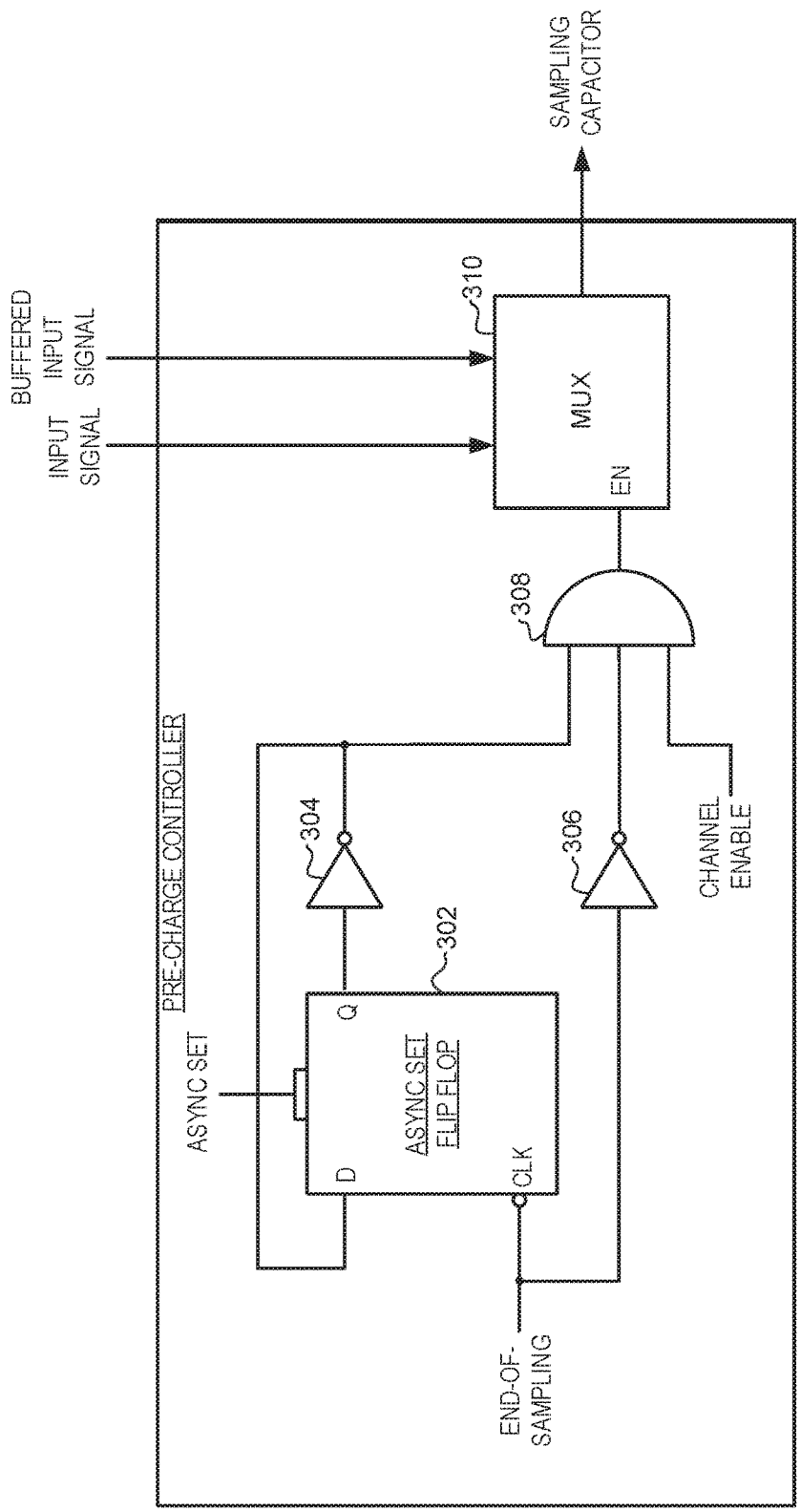
FIG. 3 shows a schematic diagram of a pre-charge controller in accordance with an embodiment.

Turning now to FIG. 3, an exemplary pre-charge controller 300 is illustrated schematically. The pre-charge controller 300 is an example of the type of controller that can be used in ADC 100 and method 200 described above. The pre-charge controller 300 includes an async set flip flop 302, inverters 304 and 306, AND gate 308, and multiplexer (MUX) 310. The pre-charge controller 300 receives an input signal, a buffered input signal, an async set signal, an end-of-sampling signal, and a channel enable signal. With these inputs, the pre-charge controller 300 selectively applies the input signal and the buffered input signal to the sampling capacitor.

Specifically, the async set signal is applied to the SET input of the flip flop 302. The end-of-sampling signal is applied to the clock input of the flip flop 302. The Q output of the flip flop 302 is inverted and fed back to the D input of the flip flop 302. The inverted output of the flip flop 302 is also applied at the AND gate 308, along with the inverted end-of-sampling signal and channel enable signal. So configured, the AND gate 308 asserts a MUX enable signal when the inverted flip-flop output, inverted end of sampling signal, and channel enable signal are all asserted.

The MUX 310 operates to selectively output the buffered input signal or the input signal to the sampling capacitor. Specifically, when the MUX enable signal is non-asserted, the MUX 310 passes the buffered input signal to the sampling capacitor. In contrast, when the MUX enable signal asserted the MUX 310 passes the input signal directly to the sampling capacitor.

Figure 4:
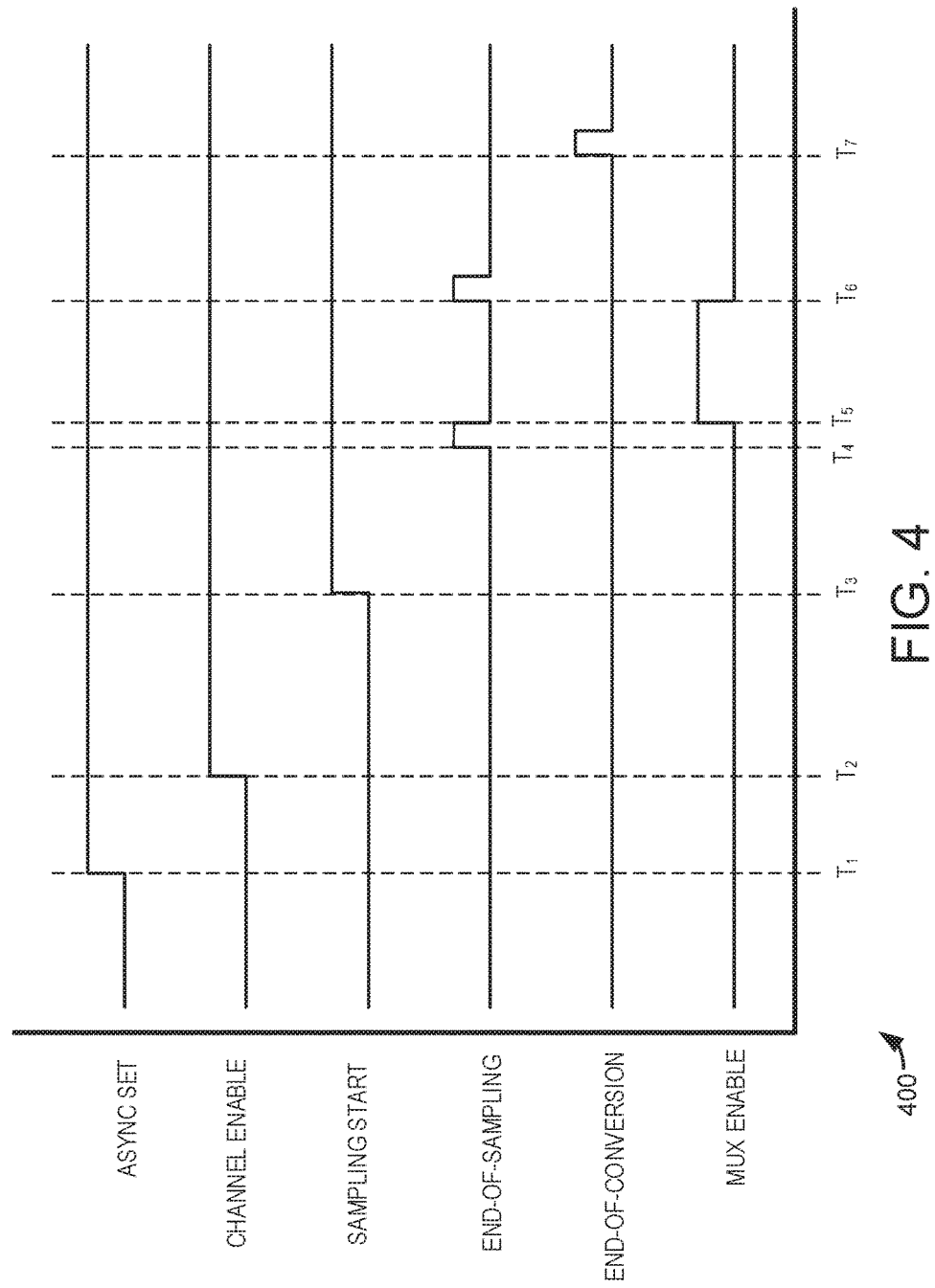
FIG. 4 shows a timing diagram in accordance with an embodiment.

Turning to FIG. 4, a timing diagram 400 illustrates exemplary waveforms of the async set signal, the channel enable signal, the sampling start signal, the end-of-sampling signal, the end-of-conversion signal, and the MUX enable signal. Referring now to FIGS. 3 and 4 together, the async set signal goes high at time $T_1$ when the ADC is initialized. This sets the async set flip flop 302, causing the Q output of the async set flip flop 302 to be set high. This setting of the async set flip flop 302 assures that the MUX enable signal (i.e., the output of the AND gate 308) is low and the MUX 310 is initially set to pass the buffered input signal to the sampling capacitor.

At time $T_2$, the channel enable signal is goes high and at time $T_3$ the sampling start signal goes high. The channel enable signal going high indicates that the current channel is being activated and the sampling start signal going high is indication that the ADC is ready to start sampling. The sampling start signal going high thus indicates the start of the first sampling cycle during which the buffered input signal is applied to the sampling capacitor.

At time $T_4$ the end-of-sampling signal goes high. This indicates the end of the first sampling cycle and the start of the second sampling cycle. Again, the end-of-sampling signal is applied to the clock input of the async set flip flop 302 which causes the flip flop 302 to go low and the output of inverter 304 to go high. The end-of-sampling signal is also inverted using inverter 306 and applied to the AND gate 308. The end-of-sampling signal going high causes output of inverter 306 to go low and in turn the output of AND gate 308 to stay low.

At time $T_5$ the end-of-sampling signal goes low. This causes the output of inverter 306 to go high and in turn the output of the AND gate 308 (the MUX enable signal) to go high. This causes the MUX 310 to now pass the input signal directly to the sampling capacitor during the second sampling cycle, where the first sampling cycle and the second sampling cycle are consecutive sampling cycles in the ADC.

At time $T_6$ the end-of-sampling signal again goes high. This indicates the end of the second sampling cycle and that the conversion of the voltage on the sampling capacitor has started. Again, because the input signal was directly applied to the sampling capacitor during the second sampling cycle the final voltage on the sampling capacitor more accurately reflects the input signal voltage. Thus, the digital output generated by the conversion can more accurately reflect the input signal, without any offset or other error caused by the buffered input signal. And again, this use of the two-step charging procedure can significantly reduce the amount of voltage drop that would otherwise occur during charging of the sampling capacitor.

The end-of-sampling signal going high at $T_6$ causes the async set flip flop 302 to output a high and output of inverter 304 to go low, which causes the output of the AND gate 308 (the MUX enable signal) to go low. At time $T_7$ the end-of-conversion signal goes high, indicating an end of the digital-to-analog conversion.

The embodiments described herein can thus provide for accurate analog-to-digital conversion while reducing the likelihood of excessive voltage drop during the conversion of weakly driven signals. Again, these embodiments reduce the likelihood of excessive voltage drop during the conversion of weakly driven signals by pre-charging the sampling capacitor used in the conversion. Specifically, the embodiments selectively apply an input signal that can be weakly driven and a buffered input signal to the sampling capacitor. For example, the embodiments can apply the buffered input signal to the sampling capacitor for a first sampling cycle to pre-charge the sampling capacitor, and then directly apply the unbuffered input signal to the sampling capacitor for a second sampling cycle to final-charge the sampling capacitor. With the sampling capacitor charged using the two stage charging, the digital output corresponding to the charge of the sampling capacitor is generated.

Furthermore, because the final charging the sampling capacitor is performed directly from the input signal, the final charge on the sampling capacitor will accurately reflect the input signal without any potential offset being introduced by the buffer or other such intervening elements. Thus, the embodiments described herein can both reduce the likelihood of excessive voltage drop during the conversion of weakly driven signals while also providing an accurate analog-to-digital conversion of those weakly driven signals.

In one embodiment, an analog-to-digital converter (ADC) is provided, comprising: an input configured to receive an input signal; a buffer coupled to the input, the buffer configured to receive the input signal and generate a buffered input signal; a pre-charge controller, the pre-charge controller configured to receive the input signal and the buffered input signal, and to selectively apply the input signal and buffered input signal to a sampling capacitor, where the pre-charge controller is configured to: apply the buffered input signal to the sampling capacitor for a first ADC sampling cycle to pre-charge the sampling capacitor; apply the input signal to the sampling capacitor for a second ADC sampling cycle to final-charge the sampling capacitor; and a converter configured to generate a digital output corresponding to the final-charge of the sampling capacitor.

In another embodiment, an analog-to-digital converter (ADC) is provided, comprising: an input configured to receive an input signal; a unity-gain buffer coupled to the input, the buffer configured to receive the input signal and generate a buffered input signal; a pre-charge controller, the pre-charge controller including a multiplexer, the pre-charge controller configured to receive the input signal and the buffered input signal, and to selectively apply the input signal and buffered input signal to a sampling capacitor using the multiplexer, where the pre-charge controller is configured to: apply the buffered input signal to the sampling capacitor for a first ADC sampling cycle to pre-charge the sampling capacitor; in response to an end-of-sampling signal after the first ADC sampling cycle, directly apply the input signal to the sampling capacitor for a second ADC sampling cycle to final-charge the sampling capacitor, where the first ADC sampling cycle and the second ADC sampling cycle are consecutive sampling cycles; and a converter configured to generate a digital output corresponding to the final-charge of the sampling capacitor.

In another embodiment, a method of performing an analog-to-digital conversion is provided, the method comprising: applying an input signal to an input; buffering the input signal to generate a buffered input signal; applying the buffered input signal to a sampling capacitor for a first ADC sampling cycle to pre-charge the sampling capacitor; applying the input signal to the sampling capacitor for a second ADC sampling cycle to final-charge the sampling capacitor; and generating a digital output corresponding to the final-charge of the sampling capacitor For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the foregoing description for the purpose of reference only, and thus are not intended to be limiting.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An analog-to-digital converter (ADC), comprising:
   an input configured to receive an input signal;
   a buffer coupled to the input, the buffer configured to receive the input signal and generate a buffered input signal;
   a pre-charge controller, the pre-charge controller configured to receive the input signal and the buffered input signal, and to selectively apply the input signal and buffered input signal to a sampling capacitor, where the pre-charge controller is configured to:
      apply the buffered input signal to the sampling capacitor for a first ADC sampling cycle to pre-charge the sampling capacitor;
      apply the input signal to the sampling capacitor for a second ADC sampling cycle to final-charge the sampling capacitor; and
   a converter configured to generate a digital output corresponding to the final-charge of the sampling capacitor, wherein the pre-charge controller is configured to receive an end-of-sampling signal from the converter, and wherein the pre-charge controller is configured to switch between applying the buffered input signal to the sampling capacitor and applying the input signal to the sampling capacitor in response to the end-of-sampling signal.

2. The ADC of claim 1, wherein the pre-charge controller includes a switch, the switch configured to selectively switch between the buffered input signal and the input signal.

3. The ADC of claim 1, wherein the pre-charge controller is configured to receive a set signal configured to set the pre-charge controller in an initial state with the buffered input signal coupled to the sampling capacitor.

4. The ADC of claim 1, wherein the buffer comprises a unity gain buffer.

5. The ADC of claim 1, wherein the pre-charge controller is configured to directly apply the input signal to the sampling capacitor for the second ADC sampling cycle to final-charge the sampling capacitor.

6. The ADC of claim 1, wherein the input signal comprises a weakly driven reference signal.

7. The ADC of claim 1, wherein the ADC is formed on a semiconductor die, and wherein the input signal comprises an internal reference signal on the semiconductor die.

8. The ADC of claim 1, wherein the input signal is a band gap reference signal.

9. The ADC of claim 1, wherein the first ADC sampling cycle and the second ADC sampling cycle are consecutive sampling cycles in the ADC.

10. An analog-to-digital converter (ADC), comprising:
    an input configured to receive an input signal;
    a unity-gain buffer coupled to the input, the buffer configured to receive the input signal and generate a buffered input signal;
    a pre-charge controller, the pre-charge controller including a multiplexer, the pre-charge controller configured to receive the input signal and the buffered input signal, and to selectively apply the input signal and buffered input signal to a sampling capacitor using the multiplexer, where the pre-charge controller is configured to:
       apply the buffered input signal to the sampling capacitor for a first ADC sampling cycle to pre-charge the sampling capacitor;

in response to an end-of-sampling signal after the first ADC sampling cycle, directly apply the input signal to the sampling capacitor for a second ADC sampling cycle to final-charge the sampling capacitor, where the first ADC sampling cycle and the second ADC sampling cycle are consecutive sampling cycles; and a converter configured to generate a digital output corresponding to the final-charge of the sampling capacitor.

11. The ADC of claim 10, wherein the pre-charge controller is configured to receive a set signal configured to set the pre-charge controller in an initial state with the buffered input signal applied to the sampling capacitor.

12. A method of performing an analog-to-digital conversion, the method comprising:

applying an input signal to an input;

buffering the input signal to generate a buffered input signal;

applying the buffered input signal to a sampling capacitor for a first ADC sampling cycle to pre-charge the sampling capacitor;

applying the input signal to the sampling capacitor for a second ADC sampling cycle to final-charge the sampling capacitor; and generating a digital output corresponding to the final-charge of the sampling capacitor.

13. The method of claim 12, wherein the step of applying the buffered input signal and the step of applying input signal comprises using a switch to selectively switch between the buffered input signal and the input signal.

14. The method of claim 12, wherein the step of applying the input signal to the input for the second ADC sampling cycle is performed in response to an end-of-sampling signal.

15. The method of claim 12, wherein the step of buffering the input signal comprising buffering the input signal with a unity gain buffer.

16. The method of claim 12, wherein the step of applying the input signal to the input for the second ADC sampling cycle comprises directly applying the input signal to the sampling capacitor for the second ADC sampling cycle to final-charge the sampling capacitor.

17. The method of claim 12, wherein the input signal comprises a weakly driven reference signal.

18. The method of claim 12, wherein the ADC is formed on a semiconductor die, and wherein the input signal comprises an internal reference signal on the semiconductor die.

19. The method of claim 12, wherein the input signal is a band gap reference signal.

* * * * *